United States Patent
Phaneuf et al.

(10) Patent No.: US 7,893,397 B2
(45) Date of Patent: Feb. 22, 2011

(54) APPARATUS AND METHOD FOR SURFACE MODIFICATION USING CHARGED PARTICLE BEAMS

(75) Inventors: Michael William Phaneuf, Ottawa (CA); Ken Guillaume Lagarec, Gatineau (CA); Alexander Krechmer, Nepean (CA)

(73) Assignee: Fibics Incorporated, Ottawa, Ontario (CA)

( * ) Notice: Subject to any disclaimer, the term of this patent is extended or adjusted under 35 U.S.C. 154(b) by 387 days.

(21) Appl. No.: 12/092,786

(22) PCT Filed: Nov. 7, 2006

(86) PCT No.: PCT/CA2006/001815
§ 371 (c)(1),
(2), (4) Date: May 6, 2008

(87) PCT Pub. No.: WO2007/051312
PCT Pub. Date: May 10, 2007

(65) Prior Publication Data
US 2008/0302954 A1      Dec. 11, 2008

Related U.S. Application Data

(60) Provisional application No. 60/733,812, filed on Nov. 7, 2005.

(51) Int. Cl.
*H01H 3/02* (2006.01)
(52) U.S. Cl. .......... 250/251; 250/492.1; 250/492.2; 250/492.21
(58) Field of Classification Search .......... 250/251, 250/492.1, 492.2, 492.21
See application file for complete search history.

(56) References Cited

U.S. PATENT DOCUMENTS

| | | | |
|---|---|---|---|
| 5,111,042 A | 5/1992 | Sullivan et al. |
| 5,851,413 A | 12/1998 | Casella et al. |
| 6,042,738 A | 3/2000 | Casey, Jr. et al. |

OTHER PUBLICATIONS

PCT Patent Application No. PCT/CA2006/001815 International Preliminary Report on Patentability dated May 15, 2008.
Valery, "Gas delivery and virtual process chamber concept for gas-assisted material processing in a focussed ion beam system", Journal of Vacuum Science and Technology, 48th International Conference, EIPBN Nov./Dec. 2004, pp. 3008-3011.
Harriott, "A second generation focused ion beam micromachining system", Proceedings of the SPIE—The International Society of Optical Engineering, vol. 773, Jun. 1987, pp. 190-194.
PCT Patent Application No. PCT/CA2006/001815, International Search Report dated Feb. 12, 2007.

*Primary Examiner*—Jack I Berman
*Assistant Examiner*—Hanway Chang
(74) *Attorney, Agent, or Firm*—Shin Hung; Borden Ladner Gervais LLP

(57) ABSTRACT

An apparatus and method for using high beam currents in FIB circuit edit operations, without the generation of electrostatic discharge events. An internal partial chamber is disposed over the circuit to be worked on by the FIB. The partial chamber has top and bottom apertures for allowing the ion beam to pass through, and receives a gas through a gas delivery nozzle. A non-reactive gas, or a combination of a non-reactive gas and a reactive gas, is added to the FIB chamber via the partial chamber, until the chamber reaches a predetermined pressure. At the predetermined pressure, the gas pressure in the partial chamber will be much greater than that of the chamber, and will be sufficiently high such that the gas molecules will neutralize charging induced by the beam passing through the partial chamber.

5 Claims, 11 Drawing Sheets

APPARATUS AND METHOD FOR SURFACE MODIFICATION USING CHARGED PARTICLE BEAMS

FIELD OF THE INVENTION

The present invention generally relates to charged particle beam systems. In particular, the present invention relates to a methods and apparatus for surface modification using charged particle beams.

BACKGROUND OF THE INVENTION

Focused Ion Beam (FIB) microscope systems have been produced commercially since the mid 1980's, and are now an integral part of rapidly bringing semiconductor devices to market. FIB systems produce a narrow, focused beam of charged particles, and scan this beam across a specimen in a raster fashion, similar to a cathode ray tube. Unlike the scanning electron microscope, whose charged particles are negatively charged electrons, FIB systems use charged atoms, hereinafter referred to as ions, to produce their beams. These ions are, in general, positively charged.

These ion beams, when directed onto a semiconductor sample, will eject secondary electrons, secondary ions ($i^+$ or $i^-$), and neutral molecules and atoms from the exposed surface of the sample. By moving the beam across the sample and controlling various beam parameters such as beam current, spot size, pixel spacing, and dwell time, the FIB can be operated as an "atomic scale milling machine," for selectively removing materials wherever the beam is placed. The dose, or amount of ions striking the sample surface, is generally a function of the beam current, duration of scan, and the area scanned. The ejected particles can be sensed by detectors, and then by correlating this sensed data with the known beam position as the incident beam interacts with the sample, an image can be produced and displayed for the operator.

FIG. 1 is a schematic of a typical FIB system. FIB system 10 includes an evacuated envelope 11 having an upper neck portion 12 within which are located a liquid metal ion source 14 and a focusing column 16 including extractor electrodes and an electrostatic optical system. Ion beam 18 passes from source 14 through column 16 and between electrostatic deflection means schematically indicated at 20 toward sample 22, which comprises, for example, a semiconductor device positioned on movable X-Y stage 24 within lower chamber 26. An ion pump 28 is employed for evacuating neck portion 12. The chamber 26 is evacuated with turbomolecular and mechanical pumping system 30 under the control of vacuum controller 32. The vacuum system provides within chamber 26 a vacuum on the order of 1×10E-7 Torr. If an etch assisting, an etch retarding gas, a deposition precursor gas, or some other reactive or non-reactive gas is used, the chamber background pressure may rise, typically to about 5×10E-5 Torr.

High voltage power supply 34 is connected to liquid metal ion source 14 and to appropriate electrodes in focusing column 16 and directing the ion beam. Deflection controller and amplifier 36, operated in accordance with a prescribed pattern provided by pattern generator 38, is coupled to deflection plates 20. A charged particle multiplier detector 40 detects secondary ion or electron emission for imaging, is connected to video circuit and amplifier 42, the latter supplying drive for video monitor 44 also receiving deflection signals from controller 36. A gas delivery nozzle 46 supplies the reactive or non-reactive gas to the surface of a material and preferably, in the path of the ion beam. A door 48 is provided for inserting sample 22 onto stage 24, which may be heated or cooled. Focused ion beam systems are commercially available from various companies, but the system shown in FIG. 1 represents one possible FIB system configuration.

During any beam raster operation executed by FIB system 10, which includes imaging, milling, gas assisted etching or deposition, the FIB beam deflection software and hardware deflects the beam in a preset pattern across the surface, generally referred to as rastering. At each preset location, the beam is left to dwell for a given period of time before moving to the next point in the raster. At its simplest, a raster pass consists of deflecting the beam at fixed increments along one axis from a start point to an end point, dwelling for a fixed dwell time at each point. At the end of a line, the beam waits a fixed retrace time before moving an increment in a second axis. The beam may return to the start point in the first axis and begin again, or may begin "counting down" the first axis from the point it had just reached (depending on whether the raster type is raster (the former) or serpentine (the latter). This process continues until all increments in both axes have occurred, and the beam has dwelled at all points in the scan.

It is well understood by those of skill in the art that FIB systems are used to perform microsurgery operations for executing design verification or to troubleshoot failed designs. This can involve physically "cutting" metal lines or selectively depositing metallic lines for shorting conductors together. As previously discussed, reactant materials such as gases, are directed at the surface of the material being processed. The reactant materials cooperate with the particle beam to enhance or modify the deposition or etching process being performed.

For example, focused ion beams are used to etch conductive materials such as tungsten from the surface of semiconductor devices to repair or modify the circuitry of the semiconductor device. As a focused ion beam is directed to the surface of the semiconductor device, an etchant material is delivered to the surface of the semiconductor device. The focused ion beam and the etchant-type reactant material will cooperate to remove material, such as tungsten film, from the semiconductor device surface. In contrast to etching, a reactant-containing metal can be used for depositing a conductive material on the substrate surface, typically as wires and as connection pads.

While FIB microsurgery is useful for semiconductor circuit design verification, the successful use of this tool relies on the precise control of the milling process. Current integrated circuits have multiple alternating layers of conducting material and insulating dielectrics, with many layers containing patterned areas. Hence the milling rate and effects of ion beam milling can vary vastly across the device.

Unfortunately, a FIB operator is responsible for halting the milling process when a metal line of interest has been sufficiently exposed or completely cut, a process known as "endpointing". Endpointing is done based on operator assessment of image or graphical information displayed on a user interface display of the FIB system. In most device modification operations, it is preferable to halt the milling process as soon as a particular layer is exposed. Imprecise endpointing can lead to erroneous analysis of the modified device. Older FIB systems operating on current state-of-the-art semiconductor devices do not provide image and graphical information with a sensitivity that is usable by the operator. This is due in part to the fact that older FIB systems will have imaging systems originally optimized for older generation semiconductor devices.

In particular, as semiconductor device features continue to decrease in size from sub-micron to below 100 nm, it has become necessary to mill smaller and higher aspect ratio FIB vias with reduced ion beam current. This significantly reduces the number of secondary electrons and ions available for endpoint detection and imaging. In addition, FIB gas assisted etching introduces a gas delivery nozzle composed of conductive material. The proximity of the nozzle to the sample surface creates a shielding effect which reduces the secondary electron detection level.

Particularly when performing circuit edit from the so-called front side of the device (accessing the circuitry from the side of the device furthest away from the silicon substrate, rather than through the substrate silicon as is done is so-called back side circuit edit), high beam currents are preferably not used due to the potential occurrence of electrostatic discharge (ESD) events, which can strike and damage the semiconductor circuit being worked on. By example, some FIB operations are limited on certain devices or even within regions of otherwise non problematic devices that are devoid of surface features, to the use of a 50 pA of beam current, otherwise the device charges up under the influence of the FIB beam, and an ESD event occurs, damaging the semiconductor device. Therefore, etch rates are slow and beam currents must be carefully controlled.

U.S. Pat. No. 5,851,413 proposes the use of a partial chamber for increasing etch rates, particularly the etch rates of the silicon substrate during backside circuit edit. FIG. 2 is an illustration of a prior art partial chamber. The partial chamber 100 is to be used within FIB chamber 26, and includes a gas delivery tube 102 for providing a gas 103, a lower chamber 104 and an upper chamber 106. The lower chamber 104 and the upper chamber 106 have an interior passage, while the upper chamber 106 has a top aperture 108 and the lower chamber 106 has a bottom aperture 110. The upper chamber 106 is in communication with gas deliver tube 102. The top and bottom apertures 108 and 110 are concentric with each other and co-axial with the axis of the beam 112. It is noted that the beam can be either an ion beam or an electron beam. The two spaced apertures provide a path for the ion beam 112 to travel through the partial chamber 100 and to impact against the surface of a semiconductor chip 114.

The partial chamber 100 is effective for concentrating a reactant gas in an area proximate to the surface to be worked on, thereby improving etching and deposition processes. Furthermore, since the gas provided by the gas delivery tube 102 is directed substantially perpendicular to the surface of the semiconductor chip 114, uniform topography can be obtained.

This partial chamber is intended to speed up the removal rate of silicon by achieving a much higher pressure of $XeF_2$ than the column could stand if it was in the main chamber. Use of the partial chamber is ideally used for backside edits, meaning etching through the bulk silicon and stopping near the device surface. However, the partial chamber is impractical for detailed etching from the backside since the pressure is typically too high, and after a while, spontaneous etching of the silicon will occur even in the absence of the beam.

Using the partial chamber for etching the front side of a semiconductor device does not give an appreciable benefit versus using a standard gas nozzle in terms of etch rate. In fact, the partial chamber will reduce the signal available for detection, however use of such a chamber for etching the front side does have a beneficial effect in terms of reducing ESD, as will be discussed below.

FIG. 3 is an illustration of an alternate partial chamber which addresses the problem of the partial chamber shown in FIG. 2. This type of partial chamber was coined a "cupola" nozzle and described in the paper titled "Gas Delivery and Virtual Process Chamber Concept for Gas Assisted Material Processing in Focused Ion Beam System", by Valery Ray, presented at the 48$^{th}$ International Conference EIPBN 2004, in San Diego, Calif., USA.

Partial chamber 200 includes a domed chamber 202 having an aperture 204 at its top, while being completely open at its bottom end 206 for passing through a beam 207. A gas delivery tube 208 provides a gas 210 to the domed chamber 202. Partial chamber 200 achieves at least the same effectiveness as partial chamber 100 of FIG. 2. A typical use of the partial chamber 200 is to enhance FIB etch rates. The advantage of partial chamber 200 is increased signal that can be detected, is subject to ESD events.

In use, the partial chamber 200 is placed a few hundred micrometers above the surface of the silicon sample 212, where the base chamber pressure is approximately 1×10E-7 Torr. A reactive gas, such as $XeF_2$, is delivered under high pressure into the partial chamber 200 until the full chamber pressure reaches approximately 8×10E-6 Torr. The ion beam is then passed through the partial chamber 200, the $XeF_2$ gas, and onto the silicon device. This will greatly enhance the etch rate of the silicon when exposed to the ion beam and the $XeF_2$ gas.

Neither U.S. Pat. No. 5,851,413 or the paper by Valery Ray discuss or address the problem of ESD mitigation. It is, therefore, desirable to provide a method and system for improving front side etch rates in FIB systems while minimizing ESD events Significant advances have been made in the field of circuit editing involving the monitoring of secondary particles generated using ion beams impinging on a circuit or sample. However, many problems remain. One of these problems regards the low yield of detected secondary particles used in monitoring milling of integrated circuits (ICs) or of samples in general. The low yield of detected secondary particles leads to poor control of milling depths, and therefore of circuit editing precision.

It is, therefore, desirable to provide a system and method for improving the yield of detected secondary particles.

Another facet of ion beam circuit editing involves gas assisted editing of circuit or samples. Such gas assisted ion beam editing includes etching and deposition of materials on a sample in a gas environment.

The physical and chemical processes at play during such etching and deposition of materials are usually temperature dependent. Thus, controlling the temperature of the portion of the circuit or sample being edited is therefore very important. However, most present techniques require that the temperature of the whole sample be changed by mounting the sample on a temperature control stage to change the temperature of the whole sample instead of only the portion being edited. This can be costly in terms of processing time and is subject to the highest temperature tolerable by the most heat vulnerable portion of the circuit or sample. Local heating of an edit portion of a circuit or sample can be achieved by the use of a laser. However, this requires special optics for the delivery and alignment of the laser, together with safety implements.

It is therefore desirable to provide a system and method for heating the sample locally during gas assisted editing of the sample.

Yet another facet of ion beam circuit editing or of circuit editing in general is that of the fabrication of ohmic contacts on circuits or samples. Attempts have been made at fabricating ohmic contacts by first performing ion beam deposition on an area of a sample and then driving a current through the sample, in the area of the ion beam deposited material. That approach has the disadvantage of providing undesired current to the part of the circuit the ohmic contact is being connected to, which can cause significant alteration and/or damage of that part of the circuit.

It is therefore desirable to provide a method of fabricating ohmic contacts on an existing circuit that is not damaging to the circuit.

SUMMARY OF THE INVENTION

It is an object of the present invention to obviate or mitigate at least one disadvantage of previous circuit edit techniques.

In a first aspect, the present invention provides a method for charge neutralization of an ion beam. The method includes positioning a partial chamber over a sample within a main chamber; injecting a gas into the partial chamber; detecting a predetermined pressure of the main chamber, the predetermined pressure being effective for promoting charge neutralization in the partial chamber; and passing the ion beam through the partial chamber and onto the sample. According to embodiment of the present aspect, the predetermined pressure of the main chamber is about 8×10E-6 Torr, the a current of the ion beam is between 500 pA and 20 nA, the gas includes a non-reactive gas or a mixture of a non-reactive gas and a reactive gas.

In a second aspect, the present invention provides method of controlling a yield of detected secondary particles at a detector, the secondary particles generated by charged particles impinging on a sample. The method includes forming a charged particle directing field, and positioning the charged particle directing field to change the yield of detected secondary particles at the detector. In an embodiment of the present aspect, positioning the charged particle directing field includes translating a field inducing circuit in at least one of a direction substantially parallel to a surface of the sample, and a direction substantially perpendicular to the surface of the sample.

In a third aspect, the present invention provides a method of editing a sample. The method includes changing a temperature of an edit region of the sample by applying a temperature differential to the edit region by a probe held at a temperature different than a temperature of the sample, thereby changing a circuit edit property of the edit region relative to a remainder of the sample, and modifying the edit region.

In a fourth aspect, the present invention provides a method of editing a circuit. The method includes providing an ion beam to an edit portion of the circuit; and contacting a heat source to the edit region.

In a fifth aspect, the present invention provides a gas nozzle for delivering a gas to a sample. The gas nozzle includes a hollow body for receiving the gas, a frusto-conically shaped aperture extending through the hollow body for receiving at least one charged particle beam, and a gas outlet orifice concentric with the frusto-conically shaped aperture for delivering the gas from the hollow body to the sample. According to embodiments of the present aspect, the angle of the frusto-conically shaped aperture is at least an angle between two charged particle beams and the hollow body is shaped to form a gas reservoir around the gas outlet orifice.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Figure 1:
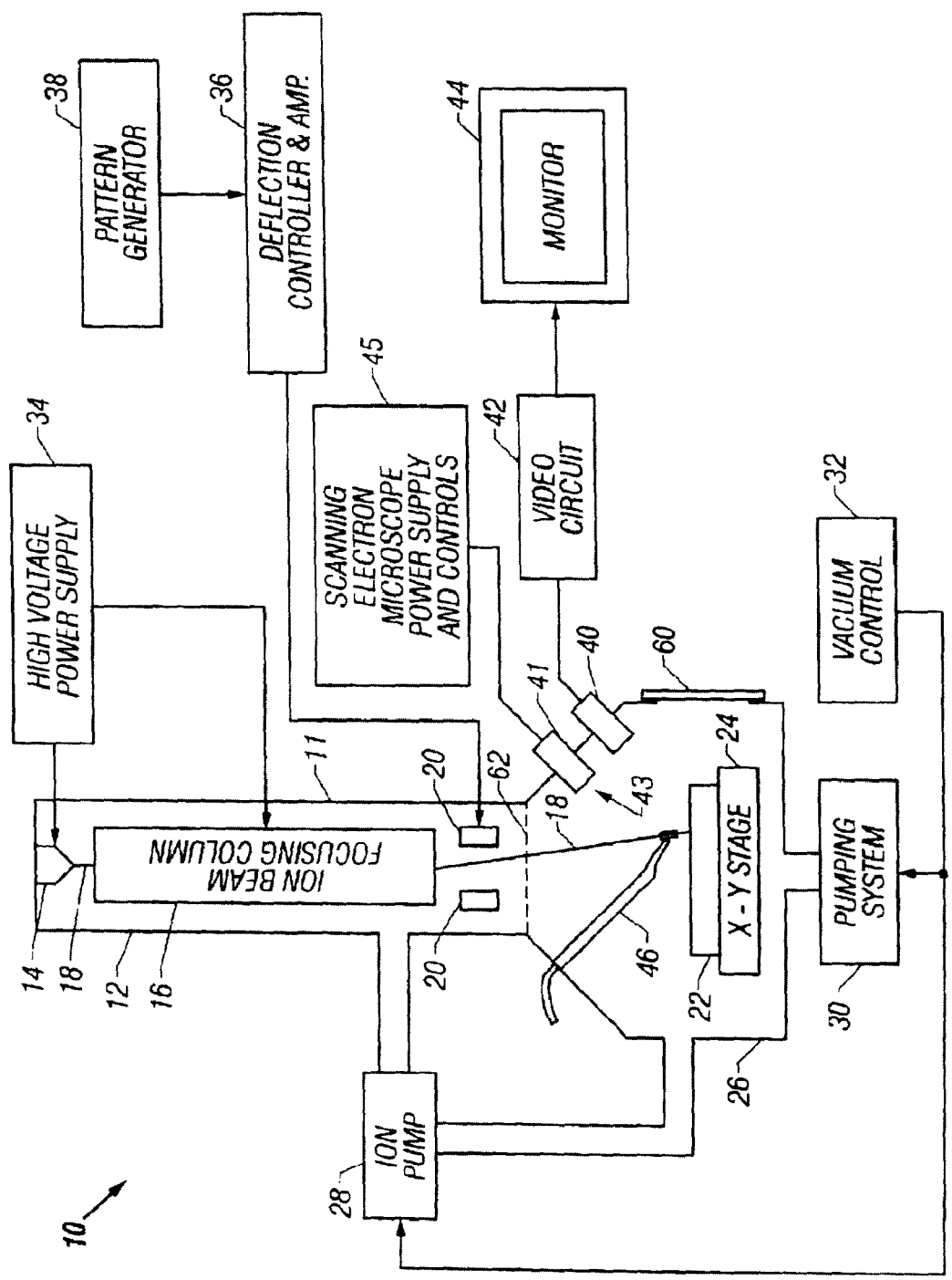
FIG. 1 is a schematic of a FIB system of the prior art.

Generally, the present invention provides an apparatus and method for using high beam currents in FIB circuit edit operations, without the generation of electrostatic discharge events. An internal partial chamber is disposed over the circuit to be worked on by the FIB. The partial chamber has top and bottom apertures for allowing the ion beam to pass through, and receives a gas through a gas delivery nozzle. A non-reactive gas, or a combination of a non-reactive gas and a reactive gas, is added to the FIB chamber via the partial chamber, until the chamber reaches a predetermined pressure. At the predetermined pressure, the gas pressure in the partial chamber will be much greater than that of the chamber, and will be sufficiently high such that the gas molecules will neutralize charging induced by the beam passing through the partial chamber.

According to an embodiment of the invention, the partial chambers 100 or 200, can be used to neutralize charge induced by a high current ion beam. Partial chambers 100 and 200 are merely examples of chambers, or concentrators, which can be used for restricting the dissipation of the provided gas(es). However, any suitable type of chamber which can create a "micro environment" having a resulting pressure within being much closer to atmospheric pressure than the native high vacuum environment of the FIB chamber 26 can be used.

Charge neutralization can be achieved by establishing a high pressure inside the partial chamber, thereby creating something analogous to a low vacuum or so-called environmental SEM, inside an otherwise "high vacuum" instrument that was not necessarily designed for low vacuum operation. More specifically, the partial chamber can be used with a non-reactive gas, such as nitrogen, at an even higher pressure than used in the enhanced etching example above. The total chamber pressure will climb somewhat, but the pressure inside the "micro environment" created by the partial chamber can reach a point where the non-reactive gas molecules will neutralize any charging that is induced by the ion beam. According to an embodiment of the present invention, the final FIB chamber pressure can be 10 times the pressure used in the prior art for gas-assisted etching or deposition.

Therefore, much higher beam currents can be employed without damaging the silicon device by electrostatic discharge. By using higher beam currents, etching rates can be improved and circuit edit can be performed more quickly. Higher beam currents can also be employed during FIB nanomachining, for example during specimen preparation for failure analysis, where the goal is to remove a portion of the integrated circuit device to allow access to a particular site for investigation as to why a failure may have occurred. The use of the high pressure "micro environment" allows FIB nanomachining at higher beam currents, resulting in faster results, without the risk of an ESD event causing an artifact that could be mistaken for the failure being investigated.

Figure 4:
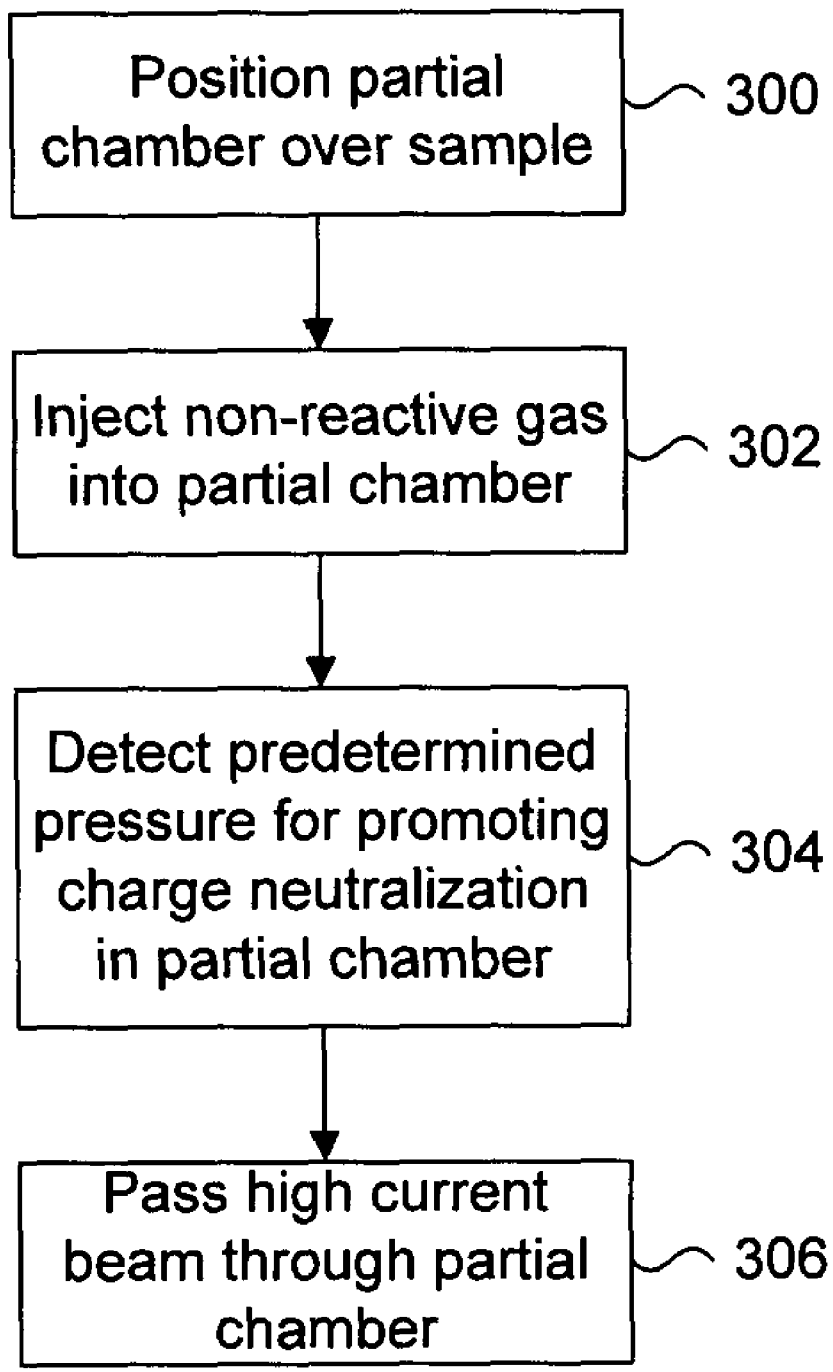
FIG. 4 is a flow chart of a charge neutralization method according to an embodiment of the present invention.

FIG. 4 is a flow chart illustrating the charge neutralization method, according to an embodiment of the present invention. The process begins at step 300, where the partial chamber is positioned over the sample to be worked on. At step 302, a non-reactive gas is injected into the partial chamber. It is presumed that the base chamber pressure is approximately $1 \times 10E-7$ Torr before non-reactive gas injection. At step 304, the FIB chamber pressure is detected at being a level which corresponds to the partial chamber pressure being sufficiently high to promote charge neutralization by the gas molecules. In a preferred embodiment, the FIB chamber should be at approximately $8 \times 10E-6$ Torr, resulting in a partial chamber pressure that is many times higher. Finally at step 306, the beam, either being a high current ion or electron beam, is passed through the partial chamber. Therefore, high beam currents can be used without risk of damaging the silicon device due to electrostatic discharge events, which are more likely to occur in the absence of the high pressure microenvironment provided by the partial chamber. In the present embodiment, the gas being injected at high pressure is 100% non-reactive gas.

However, a mixture of non-reactive gas and reactive gas can be provided at high pressure to further enhance etching/deposition. In a preferred embodiment, the injected gas can be 10% reactive gas and 90% non-reactive gas, however any proportion can be used depending upon the desired amount of reactivity. An example mix can be N2 (non-reactive) and $XeF_2$ (reactive). It is noted that both the reactive gas and the non-reactive gas molecules will provide charge neutralization at the high FIB chamber pressure that has been previously described. Accordingly, the proportion of gas can range between 100% reactive to 100% non-reactive, to tailor the amount of reactivity while achieving charge neutralization. It may be desirable that the proportion of gas can be varied, by means of external control, while the charged particle beam is incident on the target site, for example, 100% non-reactive gas can be used while the beam is being "tuned" on the sample, to provide charge neutralization without reaction, then the reactive gas can be introduced at the appropriate ratio when tuning is complete and a reaction is desired.

According to an embodiment of the present invention, the reactive gas can be provided by one gas delivery tube connected to the partial chamber, while the non-reactive gas can be provided through a second gas delivery tube. Alternatively, the two gasses can be pre-mixed and provided through a single gas delivery tube.

Figure 3:
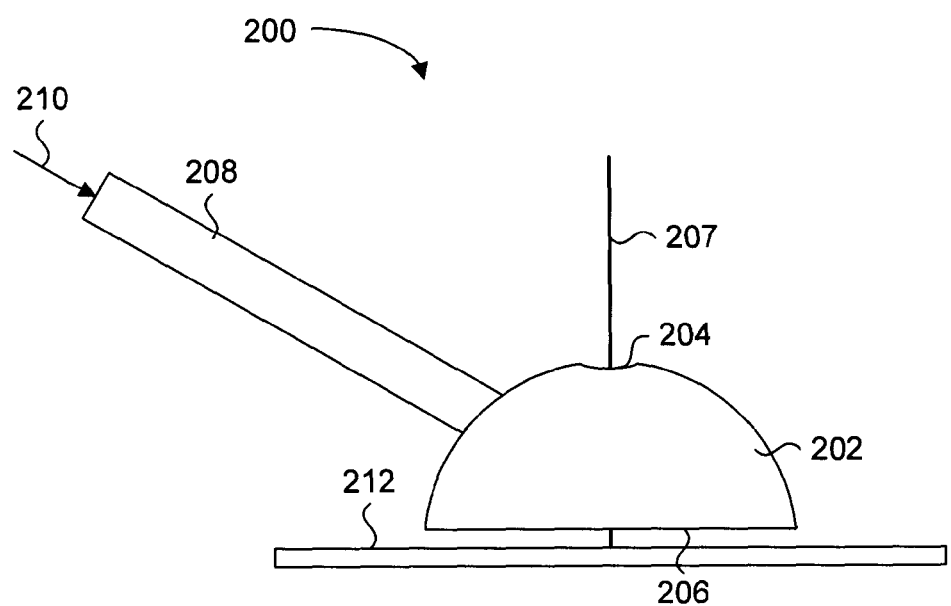
FIG. 3 is a schematic of an alternate partial chamber of the prior art.

In this presently described embodiment, the same reaction rates as the prior art scheme described for FIG. 3 can be obtained, however the added benefit of charge neutralization due to the presence of the high pressure non-reactive/reactive gas allows for a much higher beam current to be employed, thereby increasing the speed at which a process can be completed.

Experimentation with the partial chamber 100 has shown that at the high chamber pressure sufficient for promoting charge neutralization in the partial chamber, a beam current of up to 20 nA can be used without inflicting damage to the semiconductor device due to charging and ESD events. A preferable high current beam operating range lies between 500 pA and 5 nA, which is a 10 to 100 times improvement over the prior art beam current that can be used.

Figure 2:
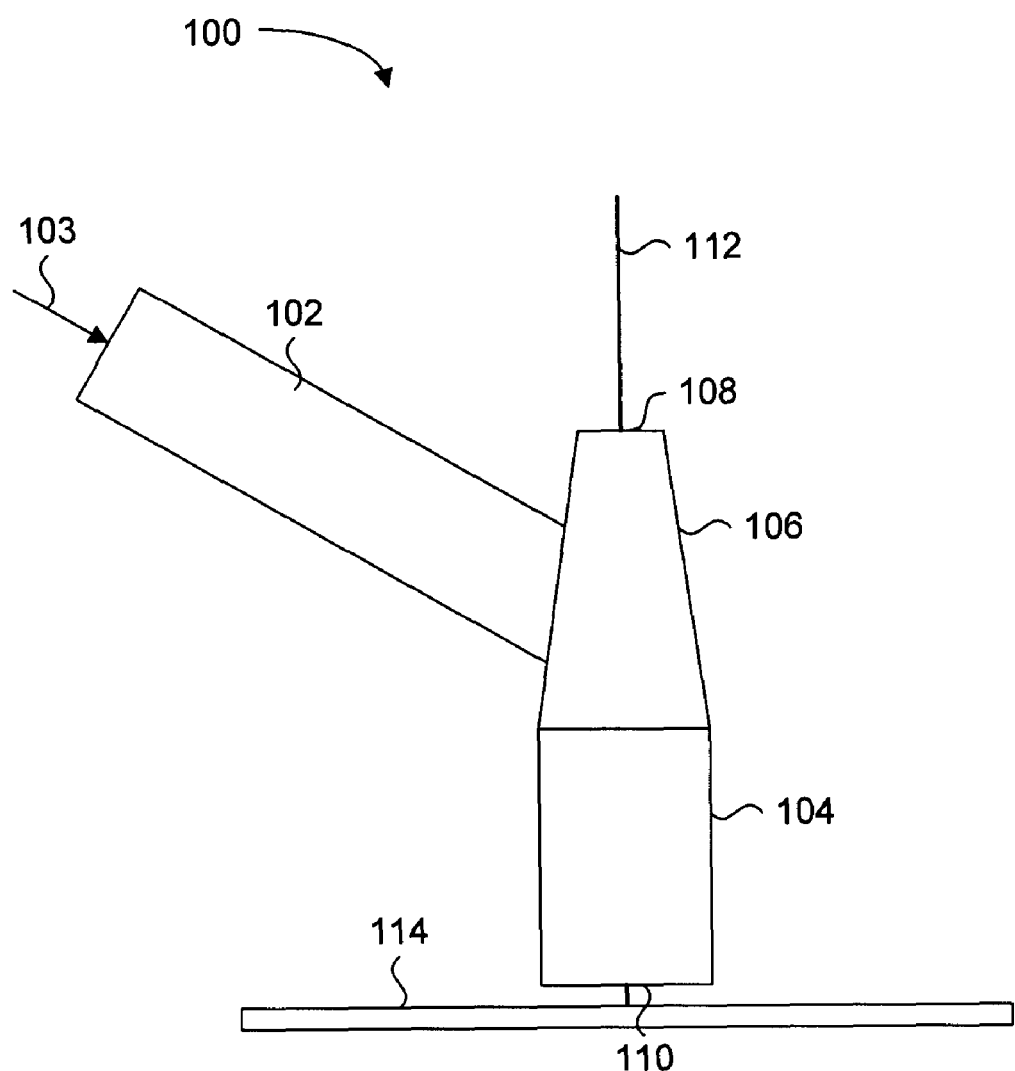
FIG. 2 is a schematic of a partial chamber of the prior art.

One disadvantage of the partial chambers 100 and 200 shown in FIGS. 2 and 3 is the high presence of gas molecules in the path of low energy electrons ejected from the sample. In the 20 nA beam current case, the high gas pressure used to neutralize causes the beam to spread out somewhat, and the emitted secondaries are diffused so the endpoint detection becomes blurry as a result. Partially due to this (incoming blurring and secondaries) and partially due to the high gas flux, the hole being opened does not end up as flat as with the standard nozzles, having a tendency to be wider than the raster size and also more bowl shaped. A bowl shape is typically deeper in the center and less deep at the edges. Both partial chambers 100 and 200 are relatively high, resulting in a long flight path through high gas pressure.

Figure 5A:
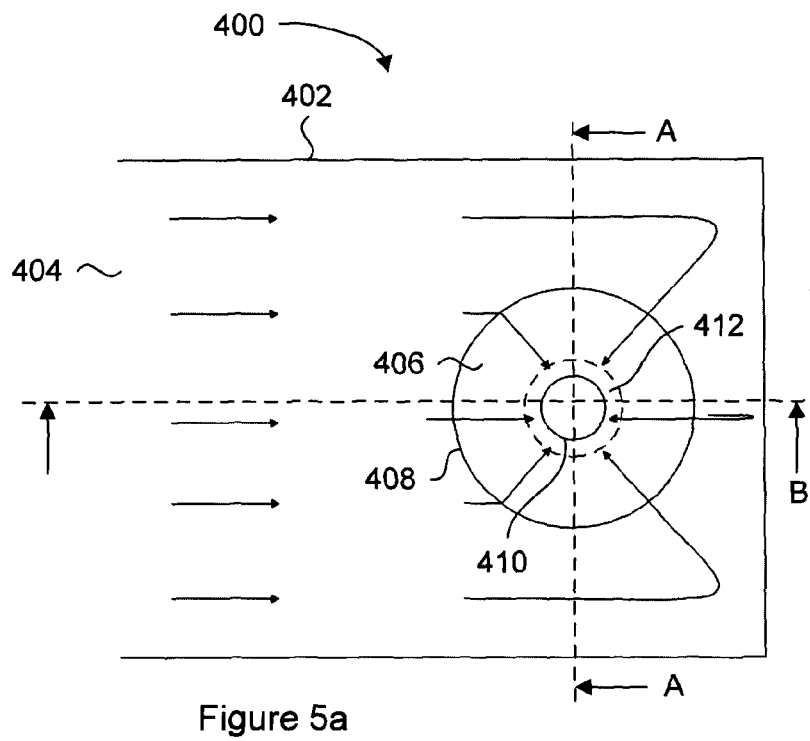
FIGS. 5a to 5c are schematics of a gas delivery nozzle according to an embodiment of the present invention.
Figure 5B:
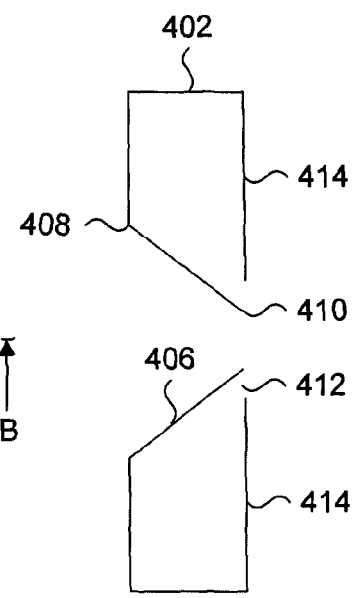
Figure 5C:
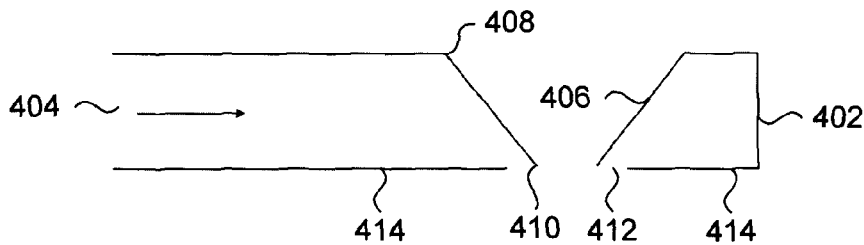

FIGS. 5a, 5b and 5c are schematics showing a novel gas nozzle according to an embodiment of the present invention. This novel gas nozzle design provides high gas flux at the sample surface, and includes a large escape angle for secondaries and reduced gas flux in the beam path between the column and the bottom of the nozzle.

FIG. 5a is a planar view of a gas nozzle 400 according to an embodiment of the invention, while FIG. 5b shows a cross-sectional end view along line A-A and FIG. 15c shows a cross-sectional side view along line B-B. Gas nozzle 400 includes a hollow body 402 with a gas inlet 404 for receiving reactive and/or non-reactive gasses, and a frusto-conically shaped hole 406 extending through hollow body 402. Aperture 406 is defined by a top opening 408 having a first area and a bottom opening 410 having a second area, where the second area is smaller than the first area. For circuit edit operations for example, the second area can be about 200 um×200 um square. While the present embodiment uses circular shaped openings, any shaped opening can be used as long as it provides a uniform gas flow and is effective for providing a uniform field gradient if it was biased. The advantage of the slanted sidewalls extending to the bottom side of hollow body 402 provides a large escape angle for ejected secondaries to pass through from the sample and to the detector of the FIB apparatus.

The bottom side of hollow body 402 includes a gas outlet orifice 412, shaped as a ring immediately adjacent to bottom opening 410 and a continuous bottom edge 414 of hollow body 402. Gas received from the inlet 404 is delivered to the sample through orifice 412. An advantage of the ring shape of gas outlet orifice 412 is that it provides a high degree of cylindrical symmetry to the gas flow. The angled side-walls allow the cone of light for an optical microscope objective or a Scwarzschild lens to enter/exit, as well as allowing two beams from two columns to both enter the target site. In a further embodiment, a gas guiding structure can be integrated into the bottom edge 414, such as an "O"-shaped ring. The ring can be configured as a sleeve extending from the bottom edge 414 and surrounding gas outlet aperture 412.

The hollow body 402 has a reservoir volume formed by the capped end 416, beyond the gas outlet orifice 412. The arrows "turning around" in FIG. 5a illustrate the gas flow to the orifice 412. The openings in the hollow body 402 on either side of the a frusto-conically shaped hole 406, along the line A-A, are sufficiently large to allow essentially unimpeded gas flow past the a frusto-conically shaped hole 406, so the pressure on the gas input end 404 side and the closed capped end 416 is substantially the same. Those skilled in the art will understand that the geometric design parameters of nozzle 400 for meeting this critera can be determined using known techniques. Therefore, the gas flow out of the orifice 412 from all sides is constant. The desired result is to obtain a uniform gas flow that is even from all sides, maintaining a high, uniform gas flux at the surface of the sample without exposing the incoming primary particle to a long, high gas flux path. The angle of the frusto-conically shaped aperture 406 is at least the angle between two columns such that (a) a second charged particle beam from a so-called dual column instrument would also have line of site to the target area when the gas nozzle 400 is in place, and (b) the optical "cone" required to perform optical imaging on the sample is not compromised while the gas nozzle 400 is inserted.

Figure 5D:
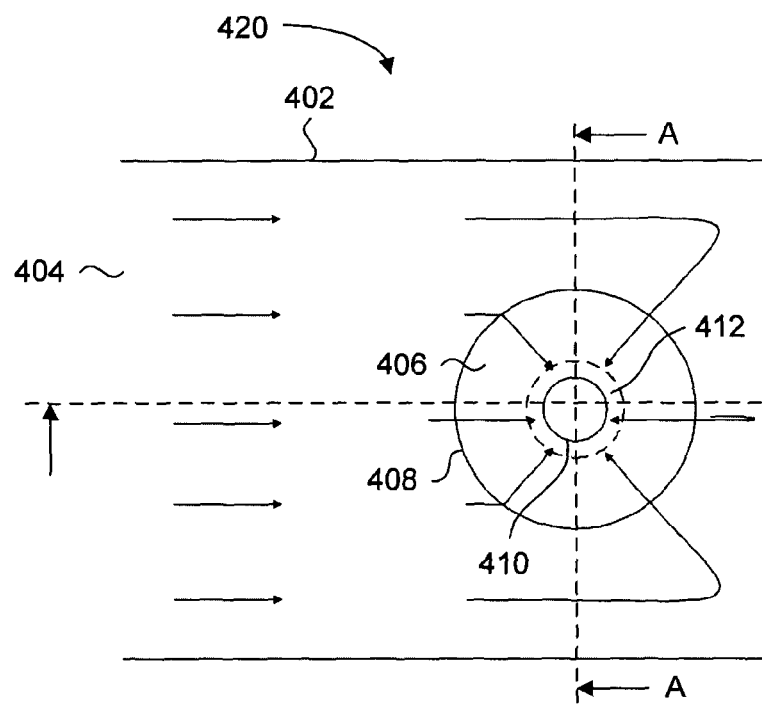
FIGS. 5d to 5f are schematics of a gas delivery nozzle according to an alternate embodiment of the present invention.
Figure 5E:
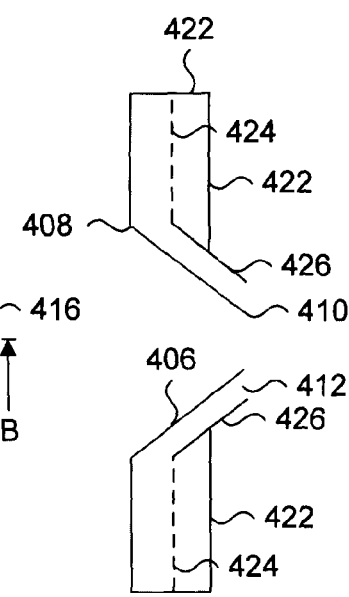
Figure 5F:
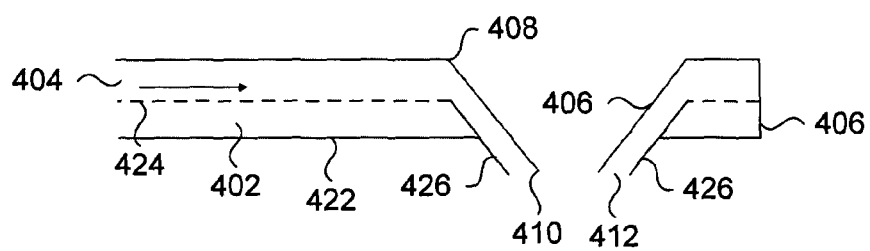

FIGS. 5d, 5e and 5f are schematics showing an alternate gas nozzle according to an embodiment of the present invention. This alternate gas nozzle 420 is similar to gas nozzle 400 shown in FIGS. 5a, 5b and 5c, and consists of the same numbered features previously described for gas nozzle 400. Gas nozzle 420 includes the following modifications to the design of gas nozzle 400. The bottom edge 422 is raised relative to the bottom of gas outlet aperture 412 and relative to the bottom edge 414 of gas nozzle 400. Alternatively, the conical wall of frusto-conically shaped aperture 406 can be extended past the bottom edge 422.

By raising the bottom edge or extending the frusto-conically shaped aperture 406, clearance is provided such that the gas nozzle 420 will not come into contact with structures, such as bond wires, which may extend from the sample surface. Therefore, gas nozzle 420 can be positioned anywhere on a sample with high versatility. In yet a further alternate embodiment, the bottom edge 422 can be raised to the position shown by dashed lines 424 to achieve the same effect. While the illustrated hollow body 402 is shown as being parallel to an underlying sample, the hollow body 402 can be angled upwards and away from sample surfaces to further facilitate clearance of structures.

Furthermore, a conical side-wall 426 can be added such that it is concentric with the conical wall of frusto-conically shaped aperture 406. Conical side-wall 426 and the conical wall of frusto-conically shaped aperture 406 cooperate to form a channel for guiding gas to the gas outlet aperture 412. Preferably, the channel will provide a uniformly directional flow of gas towards the sample. In the presently shown example, conical side-wall 426 is angled such that the distance from the conical wall of frusto-conically shaped aperture 406 is constant. In an alternate embodiment, the conical side-wall 426 can be angled such that the distance from the conical wall of frusto-conically shaped aperture 406 decreases as gas approaches the mouth of gas outlet aperture 412. In still another embodiment, a conical side-wall 426 can be added to the gas nozzle of FIGS. 5a to 5c.

This cone shape is significant for apparatus such as a Credence Systems Corporation OptiFIB, which has a Schwarschild optical lens collinear with the ion column, as it allows unimpeded viewing of the sample surface. Furthermore, there is no optical distortion caused by standard nozzles inserted into the field of view of the lens. Preferably, the cone angle great enough that it does not impede the optical image or the line of site from a second column. Furthermore, the relatively large cone angle facilitates access to the sample through the use of a nanomanipulator, for example for probing the device. The nanomanipulator can also hold a detector or position a focusing element proximate to the target area while the gas nozzle 400 (or 420) is in place and in use. According further alternate embodiments, this nozzle can be shaped with the appropriate geometry and electrically biased to provide a concentric electric field, for providing a final deceleration of the electrons from a primary electron beam. For example, a 200 eV incident electron can be decelerated by a 150 V bias of the nozzle, to provide a 50 V landing energy while maintaining the improved properties of the higher energy electron though the bulk of its flight path. In order to counter re-absorption of secondary particles by the sample, the gas nozzle 400 and the sample can be biased, relative to the incoming electron, to slow down an electron and accelerate secondary electrons away from the surface and out to a detector.

In further alternate embodiments, elements on the nozzle, alone or in combination with substrate biasing, can focus the secondary particles towards a detector. It is noted that the nozzle itself can be used as a detector by integrating detector elements, such as diodes to the bottom edge 422, in a way similar to the Nordlys II detector sold by HKL Technology. Alternately, the a portion of or the entire bottom edge 422 can be implemented as a detector.

Figure 6:
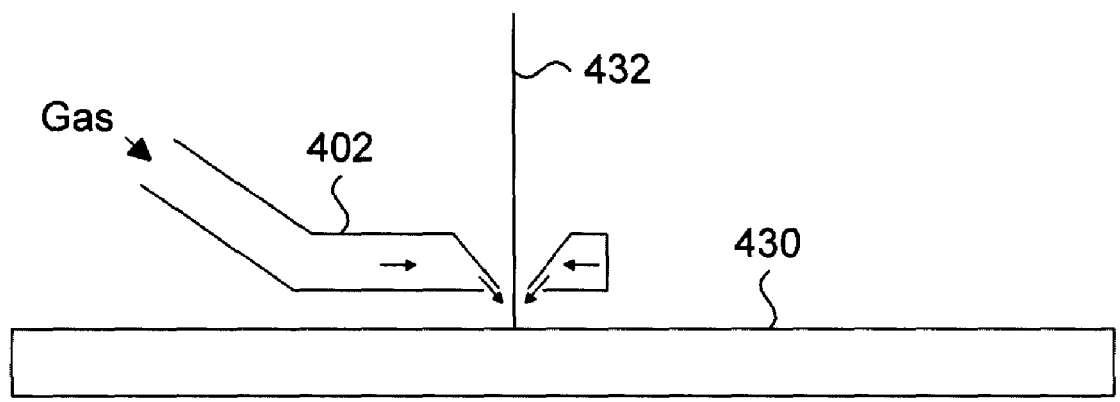
FIG. 6 is a side-view of the gas nozzle of FIGS. 5a to 5c in use.

FIG. 6 illustrates the gas nozzle 400 of FIG. 5a positioned over a sample 430, with gas being provided through the hollow body 402 and applied to the surface of the sample 430 through the gas outlet orifice 412. A focused ion beam 432 can then be directed through the frusto-conically shaped aperture 406 and onto the sample 430.

Figure 7:
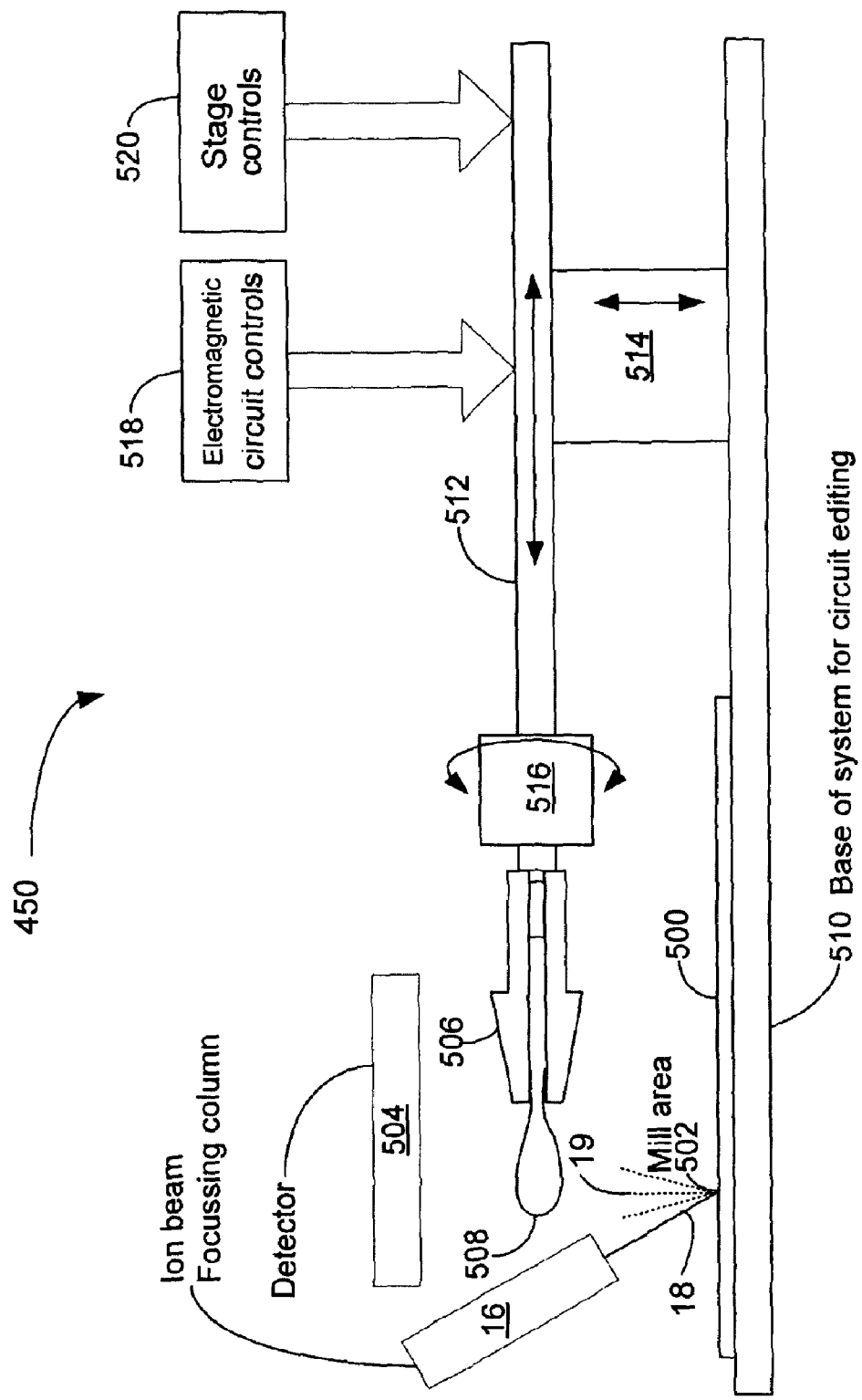
FIG. 7 shows an embodiment of a circuit editing apparatus of the present invention using an electromagnetic field circuit.

FIG. 7 shows an embodiment of a circuit editing apparatus 450 of the present invention. The apparatus 450 includes a base 510 onto which an integrated circuit (IC) or sample 500 can be mounted by any suitable means. An ion beam focusing column 16 produces an ion beam 18 used in milling a milling area 502 of the sample 500. Secondary particles 19 milled from the milling area 502 sputter away from the milling area 502 and are detected at detector 504, which can be coupled to any suitable circuitry for measuring, monitoring and/or visualizing the progress in milling the sample 500.

Generally, the secondary particles 19 are not all detected by the detector 504. This is the result of various factors such as the mismatch in the solid angle into which the secondary particles 19 are sputtered and the detection solid angle of the detector 504. Other factors leading to a less than optimal detection yield of the secondary particles 19 include the natural tendency of the secondary particles 19 to return to the sample 500 and the presence of undesired electric and/or magnetic fields causing the secondary particles 19 to stray away from the detector 504.

The present invention provides an increase in detected secondary particles 19 by introducing one or more electrostatic or electromagnetic fields (not shown) in the circuit editing apparatus 450. These fields can be provided by a charged particle directing field. In the following, the singular form of electromagnetic field inducing element (EFIE) is used but it is to be understood that it can include more than one EFIE. The additional EFIE can be fixed or variable and serve to alter the trajectory and/or the speed of the secondary particles 19. The additional EFIE field is such that its presence changes the yield of detection of secondary particles 19 at the detector 504. For the purpose of the description, the term electromagnetic field is to be understood as meaning either an electric field, a magnetic field, or a combined electric and magnetic field, and includes electrostatic elements, which those skilled in the art realize are more effective in guiding charged secondary particles more massive than electrons.

The additional EFIE can be produced by any suitable EFIE element such as EFIE element 508, also referred to as an electromagnetic circuit. Element 508 is shown as a loop of conductive material held by a manipulator 506. Manufacturers of such manipulators, also referred to as nanomanipulators, includes Zyvex™ Corporation of Texas. The element 508 can also be a chamber of the same type as the partial chamber 200.

The element 508 can produce an electric field when subjected to a voltage, a magnetic field when traversed by a current (or when composed of a permanent magnet, at least in part), or a combined electric and magnetic field when subjected to a current and a voltage.

Although shown as a loop, the element 508 can be of any appropriate shape and include any suitable material. When only an electric field is required to be produced by the element 508, the shape of the element 508 need not be that of a loop. The shape of the element 508 can be variable in order to change the geometry and/or the strength of the EFIE produced by the element 508. For example, the loop defined by the element 508 can be made bigger or smaller by any suitable means such as, a manipulator 506 with expandable jaws.

The EFIE produced by element 508 is controlled by an electromagnetic circuit controller 518, which is connected to the element 508 by any suitable means. Alternatively, the element 508 can be a constant field element such as, for example, a permanent magnet. Particularly suited for this are rare earth magnets that can provide relatively strong fields for small magnet size. Such permanents magnets can be located anywhere in the circuit editing apparatus such as, for example, on the base 510

The element 508 can be fixed in position inside the circuit editing apparatus 450 or can be movable within the circuit editing apparatus 450 as shown in Fig. A. The manipulator 506 to which the element 508 can provide fine motion in all axes and can be connected can be coupled to a rotational stage 516, a horizontal translational stage 512 and a vertical translational stage 514, or to any number and combinations of rotational and translational stages. As will be understood by a worker having ordinary skill in the art, any number of elements such as element 508 can be disposed in the circuit editing apparatus 400 to modify the yield of detection of secondary particles 19.

The rotational stage 516 and the translational stages 512 and 514 can be controlled by any suitable controlling means, generally depicted as stage controls 520.

The positioning of the element 508 to a specific location within the circuit editing apparatus 450 can be straightforward when the rotational stage 516 and the translational stages 512 and 514 include calibrated encoders. Otherwise, the positioning of the element 508 can be achieved through calibration or direct observation.

Alternatively to providing an element 508 to create an electromagnetic field to increase the detection yield of secondary particles 19, it is also possible to provide a bias voltage to existing parts of the circuit editing apparatus 450. For example, it is possible to provide a bias voltage to parts of a gas delivery system (not shown), which is part of the circuit editing apparatus 450.

The process of increasing the detection yield of secondary particles 19 can be automated. In this case, a signal from the detector 504 is provided to a processor (not shown) that controls the electromagnetic circuit controls 518 and the stage controls 520. The processor can include a computer program product with instructions to adjust the electromagnetic circuit controls 518 and the stage controls 520 until a pre-determined signal strength or signal condition is attained.

Gas based chemistries can be used for gas assisted etching or deposition. Selectivity of this process, i.e. the ability to act on one material much more so than on another, is often very important. As the rate and quality of these processes can be controlled by moderating the surface adsorption rate and "sticking time" of the gas molecules, which typically is reduced as temperature is increased, and controlled by the thermal catalysis of these processes, which typically improves with temperature, controlling the temperature either locally or generally can be advantageous.

Figure 8:
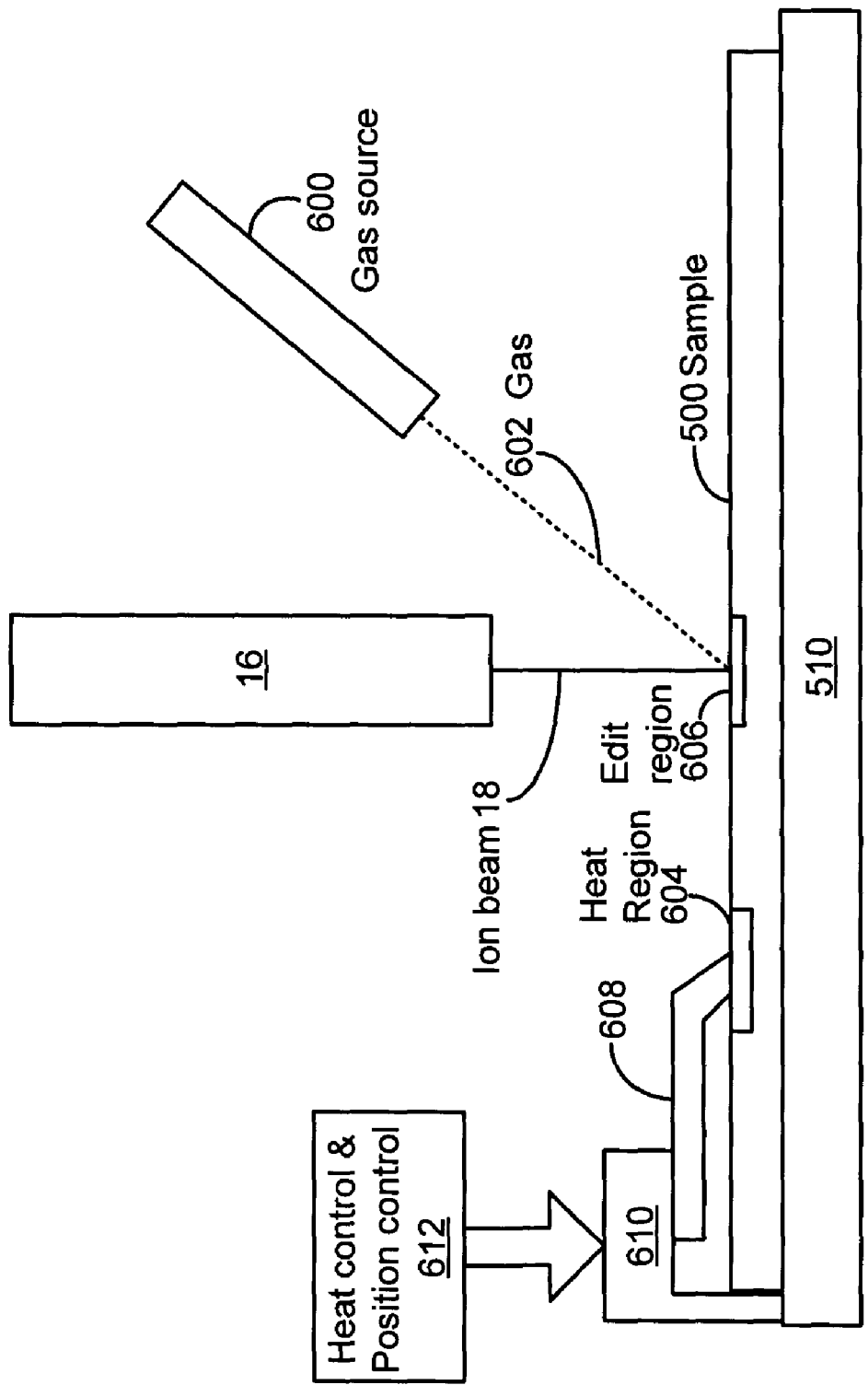
FIG. 8 shows an embodiment of a circuit editing apparatus of the present invention using a heat source in a heat region to heat an edit region of a sample.

FIG. 8 shows a system used in performing gas assisted ion beam editing of a circuit or sample, in accordance with the present invention.

The sample 500 is fixed to the base 510 through any suitable means. An edit region 606 is subjected to a flow of gas 602 provided by a gas source 600. The edit region 606 is also subjected to the charged particle beam 18 provided by the charged particle beam focusing column 16. A heat region 604, which may be physically removed from the edit region 606, but in thermal contact with the edit region, is in contact with a heat source 608, which is secured by any suitable means to a positioner and heater 610. The positioner and heater 610 is controlled by heat and position controls 612.

In operation, the heat source 608 is positioned and brought in contact with the heat region 604 of the sample, which is in thermal contact with the edit region 606. For example, the heat region 604 and the edit region 606 can be part of a same metal interconnect (not shown), the metal interconnect providing heat flow between the heat region 604 and the edit region 606. Any type of metal or heat conducting semi-conductor thermal connection, or any other suitable type of heat conductor, can be used. According to an alternate embodiment of the invention, localized cooling can be achieved using the previously described apparatus coupled with a cooling element or heat sink.

The positioner and heater 610 can include any type of horizontal, vertical and rotational positioners. It can also include any type of heat source suitable for heating the heat source 608. The positioner and heater 610 can further include any type of temperature sensing means for measuring the temperature of heat source 608. An example of such a temperature sensing means is discussed below.

For example, manipulators such as the manipulator 506 discussed above can be used as a local heating tool, through heating of a resistive element, such as a low doped silicon micro electromechanical system (MEMS) device, attached to the manipulator 506. In the case of a silicon "nano-tweezer" MEMS device, the device will open a known amount at a given temperature, thereby allowing direct measurement of the temperature of the "nano-tweezer" by straightforward measurement of the tweezer gap.

Temperatures in excess of 400° C. can be reached, which provides an excellent temperature range (from room temperature to 400°) for optimizing the enhancement or retarding of gas related processes. For example, one could expose a number of metal interconnect lines using a gas that preferentially removes dielectric over metal, then switch to a gas that preferentially removes metal over dielectric, and touch a particular line with the heat source 608, retarding the removal rate of that line or enhancing the removal rate of that line, depending on the conditions. Of course, the shape of the heat source 608 can be varied and is not limited to the "tweezer" approach, and single point probes, dual point fixed width, flat probes and other shapes may be used depending on the circumstances and room for access. One skilled in the art will also realize that one type of tip can be attached to another to form the heat source, for example a needle formed from a refractory metal needle as tungsten can be affixed to the MEMS device outlined above so physical contact with the heat region 604 occurs through the tungsten needle, reducing the chance that alloying between the silicon MEMS device and the heat region 604 will occur.

Figure 9:
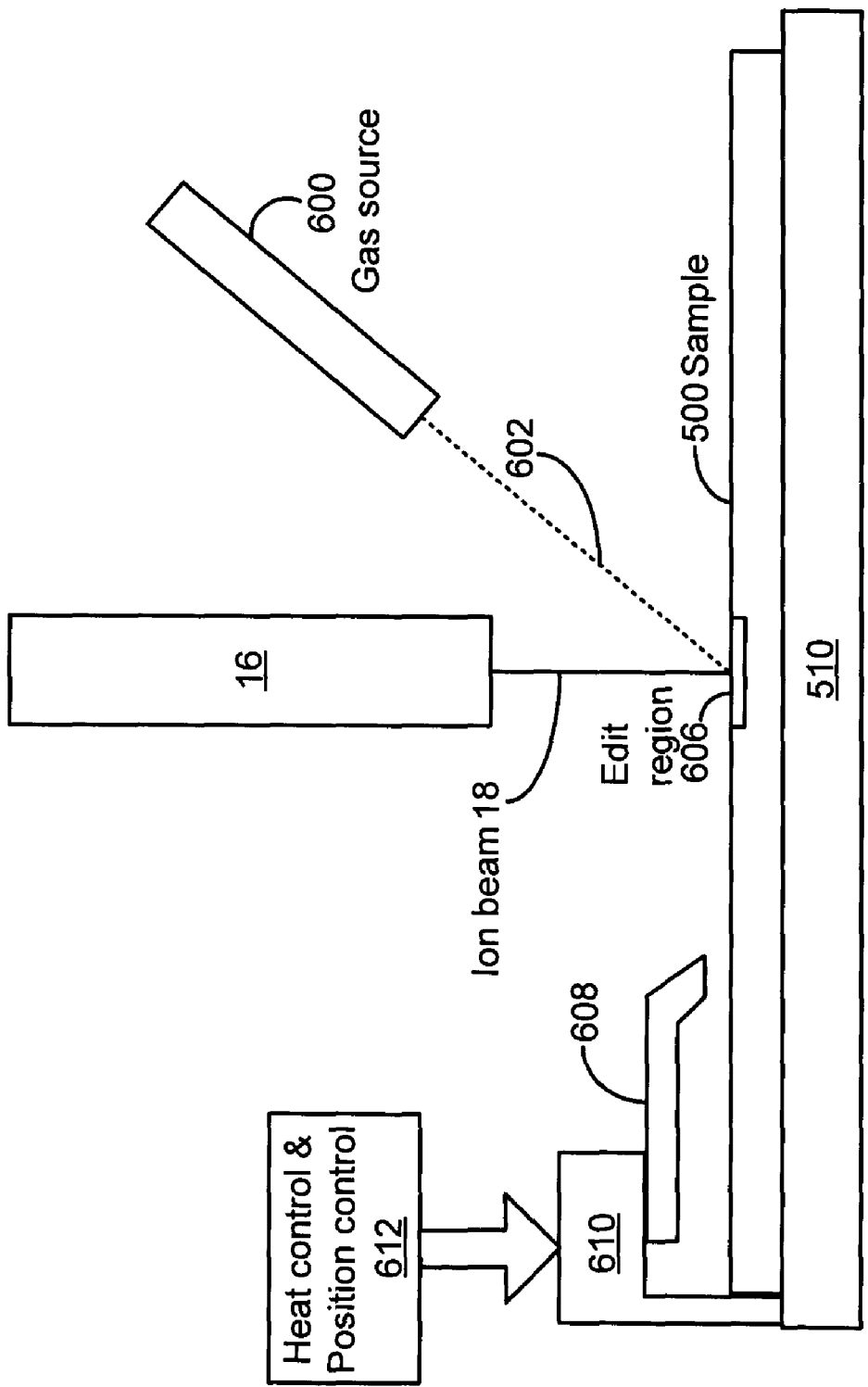
FIG. 9 shows the editing a circuit by an ion beam.
Figure 10:
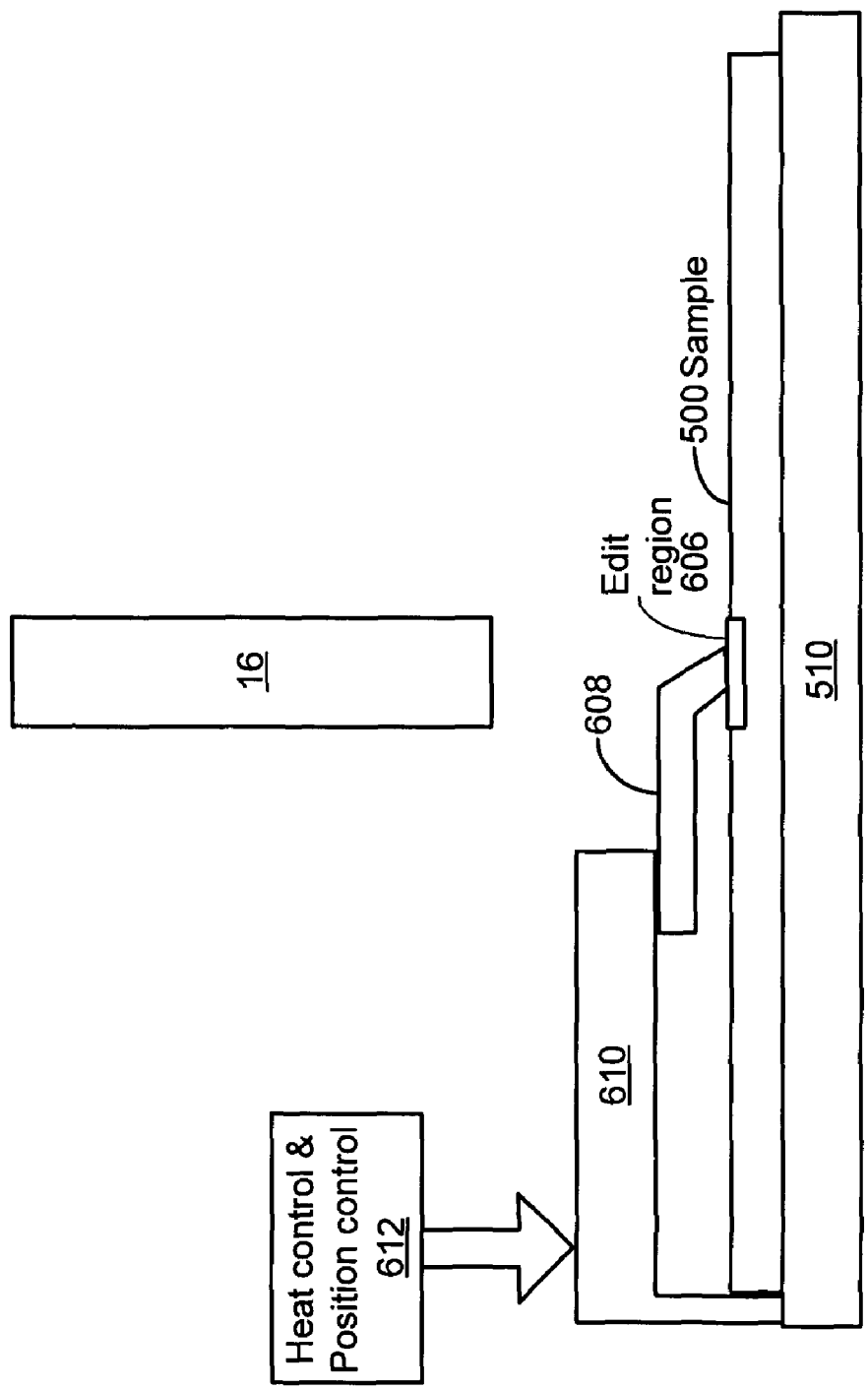
FIG. 10 shows the editing of circuit by applying heat to an ion beam edited portion of a circuit.

FIG. 9 shows the sample 500 receiving a charged particle beam from the charged particle column 16, the particle beam 18 impinging on the edit region 606 in the presence of a deposition gas 602. The heat source 608 may be at that time removed from the edit region 606. Once a sufficient number of charged particles have induced deposition on, the edit region 606, the charged particle beam 18 is removed from the edit region 606. The heat source 608 is then brought into contact with the edit region 606 by the heat and position controls 612 and heat is applied locally to the edit region 606.

The heat applied to the edit region is used to anneal the deposited material and the edit region in order to improve the quality of the deposition and/or to form an ohmic contact between the deposited material and the edit region 606 of the sample 500, which could be, for example, doped silicon.

The use of heat sources such as heat source 608, carefully engineered so that minimal current passes through the tip of the heat source to the device while still supplying sufficient heat to achieve the necessary reaction, be it an ohmic contact or some other result, such as a better quality deposition or removal of material, is preferable to the creating of heat by providing a current to flow through the circuit, which can damage the circuit.

In an alternate embodiment, a focused x-ray source can be used for localized heating of a semiconductor device. While the presently discussed embodiments are described for localized heating, localized cooling can be achieved using the same apparatus. Hence, embodiments of the invention can include simultaneous local cooling and heating of different areas of a semiconductor device.

The previously described method and apparatus for charge neutralization of an ion beam can be used in single column systems, i.e. a FIB system. However, dual column systems are available which can provide both an ion beam and an electron beam. Dual column systems combine FIB capabilities with scanning electron microscopy imaging capabilities. In such systems, charge neutralization can be achieved by using both beams concurrently and in proximity to each other. Therefore, one beam will effectively neutralize the other. Preferably, both columns are collinear, meaning that both ion and electron beams are positioned in the same axis. The sample can be heated or cooled in order to optimize gas adsorption so as to minimize gas pressure in the chamber so as to not interfere with low energy electrons flight. This technique lends itself to work in high aspect ratio holes as opposed to scanning probe.

In the preceding description, for purposes of explanation, numerous details were set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention. For example, specific details are not provided as to whether the embodiments of the invention described herein are implemented as a software routine, hardware circuit, firmware, or a combination thereof.

The above-described embodiments of the present invention are intended to be examples only. Alterations, modifications and variations may be effected to the particular embodiments by those of skill in the art without departing from the scope of the invention, which is defined solely by the claims appended hereto.

The invention claimed is:

1. A method for charge neutralization of an ion beam, comprising:
   a) positioning a partial chamber over a sample within a main chamber;
   b) injecting a gas into the partial chamber;
   c) detecting a predetermined pressure of the main chamber, the predetermined pressure being effective for promoting charge neutralization in the partial chamber; and,
   d) passing the ion beam through the partial chamber and onto the sample.

2. The method for charge neutralization of claim 1, wherein the predetermined pressure of the main chamber is about 8×10E-6 Torr.

3. The method for charge neutralization of claim 1, wherein a current of the ion beam is between 500 pA and 20 nA.

4. The method for charge neutralization of claim 1, wherein the gas includes a non-reactive gas.

5. The method for charge neutralization of claim 1, wherein the gas includes a mixture of a non-reactive gas and a reactive gas.

* * * * *